(12) United States Patent
Wang

(10) Patent No.: US 11,820,559 B2
(45) Date of Patent: Nov. 21, 2023

(54) WATERPROOF CONTAINER

(71) Applicant: BlackBerry Limited, Waterloo (CA)

(72) Inventor: Enliang Wang, Kitchener (CA)

(73) Assignee: BlackBerry Limited, Waterloo (CA)

( * ) Notice: Subject to any disclaimer, the term of this patent is extended or adjusted under 35 U.S.C. 154(b) by 19 days.

(21) Appl. No.: 17/503,154

(22) Filed: Oct. 15, 2021

(65) Prior Publication Data

US 2023/0124007 A1 Apr. 20, 2023

(51) Int. Cl.
| | |
|---|---|
| *B65D 43/02* | (2006.01) |
| *B65D 1/22* | (2006.01) |
| *B65D 25/10* | (2006.01) |
| *B65D 53/02* | (2006.01) |

(52) U.S. Cl.
CPC ........... *B65D 43/0216* (2013.01); *B65D 1/22* (2013.01); *B65D 25/10* (2013.01); *B65D 53/02* (2013.01); *B65D 2543/00194* (2013.01); *B65D 2543/00453* (2013.01); *B65D 2543/00972* (2013.01)

(58) Field of Classification Search
CPC ...... B65D 43/0216; B65D 1/22; B65D 25/10; B65D 53/02; B65D 2543/00194; B65D 2543/00453; B65D 2543/00972
USPC .......... 220/797, 378, 592.05, 62.18
See application file for complete search history.

(56) References Cited

U.S. PATENT DOCUMENTS

| | | | |
|---|---|---|---|
| 697,681 A | 4/1902 | Smelker | |
| 2,550,493 A * | 4/1951 | Ohlson | B65D 53/02 220/849 |
| 2,711,766 A * | 6/1955 | Archer | A45D 40/0068 D9/504 |
| 5,330,068 A * | 7/1994 | Duhaime | F16J 13/12 277/642 |
| 5,574,254 A | 11/1996 | Mori et al. | |
| 5,908,037 A | 6/1999 | Pierson | |
| 6,629,619 B2 * | 10/2003 | Sato | H02G 3/088 220/378 |
| 6,883,804 B2 | 4/2005 | Cobb | |
| 2001/0019064 A1 * | 9/2001 | Jacques | A47K 10/421 221/63 |
| 2003/0000720 A1 * | 1/2003 | Sato | H02G 3/088 174/50 |

(Continued)

FOREIGN PATENT DOCUMENTS

| | | |
|---|---|---|
| CN | 2814033 Y | 9/2006 |
| CN | 2936980 Y | 8/2007 |

(Continued)

OTHER PUBLICATIONS

Extended European Search Report, EP Application No. 22201379, dated Mar. 13, 2023, pp. 1-9.

*Primary Examiner* — J. Gregory Pickett
*Assistant Examiner* — Niki M Eloshway
(74) *Attorney, Agent, or Firm* — Moffat & Co

(57) ABSTRACT

A waterproof container is provided, the waterproof container including a base portion, the base portion having a base; an outer wall extending from the base; and an inner wall disposed inwardly from the outer wall, thereby forming a channel between the inner wall and the outer wall; and a lid portion, the lid portion having: a slot within the lid portion; and a seal configured to fit within the slot, the seal including a groove therein, wherein the groove of the seal is configured to accept an end of the inner wall therein when the lid portion is affixed to the base portion.

13 Claims, 11 Drawing Sheets

(56) References Cited

U.S. PATENT DOCUMENTS

| | | | |
|---|---|---|---|
| 2004/0124200 A1 | 7/2004 | Yuhara | |
| 2007/0170190 A1* | 7/2007 | Milesi | A45D 40/22 |
| | | | 220/806 |
| 2011/0147246 A1* | 6/2011 | Cheng | H05K 5/061 |
| | | | 206/320 |
| 2013/0292383 A1* | 11/2013 | Mullaney | H05K 5/062 |
| | | | 277/654 |
| 2013/0319716 A1 | 12/2013 | Rost et al. | |
| 2015/0251835 A1 | 9/2015 | Eom | |
| 2016/0236812 A1* | 8/2016 | Sze | B65D 43/0222 |
| 2018/0183175 A1 | 6/2018 | Coenegracht et al. | |
| 2019/0234671 A1* | 8/2019 | Stanford | B65D 81/3811 |

FOREIGN PATENT DOCUMENTS

| | | |
|---|---|---|
| CN | 201416637 Y | 3/2010 |
| CN | 20195399 U | 8/2011 |
| CN | 203463643 U | 3/2014 |
| CN | 204114112 U | 1/2015 |
| CN | 204201078 U | 3/2015 |
| CN | 204280190 U | 4/2015 |
| CN | 205755120 U | 11/2016 |
| CN | 106678370 A | 5/2017 |
| CN | 208474490 U | 2/2019 |
| CN | 209371805 U | 9/2019 |
| CN | 209834434 U | 12/2019 |
| CN | 212074975 U | 12/2020 |
| CN | 212247021 U | 12/2020 |
| JP | 2007046415 A | 2/2007 |

* cited by examiner

WATERPROOF CONTAINER

FIELD OF THE DISCLOSURE

The present disclosure relates to containers, and in particular relates to containers capable of being mounted in outdoor environments.

BACKGROUND

Containers may be deployed in areas where they may be subject to weather and environmental conditions. For example, in some embodiments, electronics used for monitoring, tracking or other purposes may be installed within a container, which may then be mounted to a fixed or movable platform.

If the contents of the container are sensitive to moisture, it is important that the container prevent moisture from penetrating into the interior of the container. This has been done in various ways in the past. In some cases, a container may be sealed utilizing plastic laser welding once the contents of the container are installed. However, if the contents of the container need to be serviced or accessed, the container will need to be destroyed in order to access such contents.

In other cases, seals may be sandwiched between a lid and a container base. However, such seals may be reliant on pressure being maintained between the lid and the container in order to provide a watertight seal, and if the pressure is reduced, for example due to vibrations of a vehicle, then water penetration may occur. In other cases, the seal material may cause the container to warp, thus providing further points where water penetration may occur.

BRIEF DESCRIPTION OF THE DRAWINGS

The present disclosure will be better understood with reference to the drawings, in which.

DETAILED DESCRIPTION OF THE DRAWINGS

Figure 1:
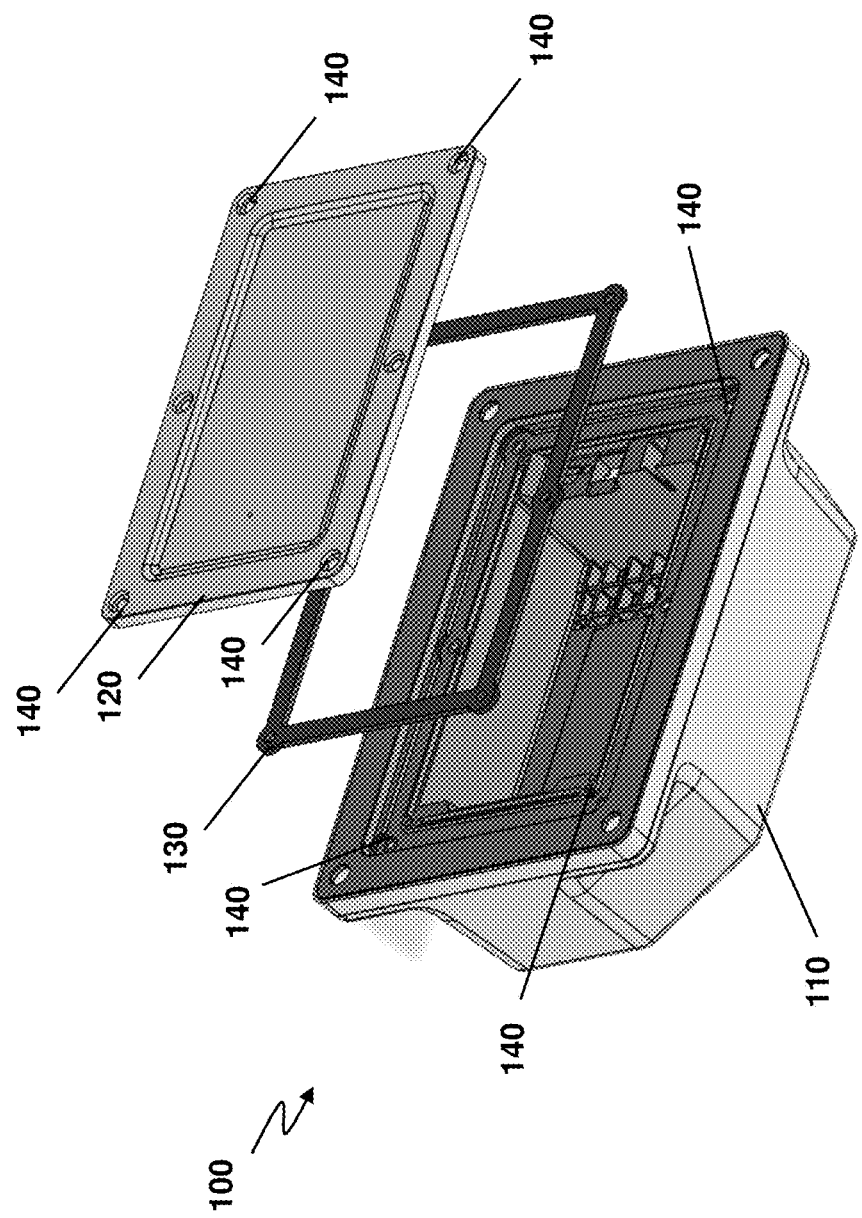
FIG. 1 is a perspective view of a container having a rubber seal between a lid and a base portion of the container.

The present disclosure provides a waterproof container comprising: a base portion, the base portion comprising: a base; an outer wall extending from the base; and an inner wall disposed inwardly from the outer wall, thereby forming a channel between the inner wall and the outer wall; and a lid portion, the lid portion comprising: a slot within the lid portion; and a seal configured to fit within the slot, the seal including a groove therein, wherein the groove of the seal is configured to accept an end of the inner wall therein when said lid portion is affixed to said base portion.

The present disclosure further provides a waterproof container comprising: a base portion, the base portion comprising: a base; an outer wall extending from the base; and an inner wall disposed inwardly from the outer wall and extending at an obtuse angle from the outer wall or the base, thereby forming a channel between the inner wall and the outer wall; and a lid portion, the lid portion comprising: a slot within the lid portion; and a seal configured to fit within the slot, the seal including a groove therein, wherein the groove of the seal is configured to accept an end of the inner wall therein when said lid portion is affixed to said base portion.

The present disclosure further provides a waterproof container comprising: a base portion, the base portion comprising: a base; an outer wall extending from the base; and an inner wall disposed inwardly from the outer wall, thereby forming a channel between the inner wall and the outer wall; and a lid portion, the lid portion comprising: a slot within the lid portion; and a seal configured to fit within the slot, the seal including a groove therein, the groove being flared at an out end thereof, wherein the groove of the seal is configured to accept an end of the inner wall therein when said lid portion is affixed to said base portion.

Containers may be used for a variety of purposes. In one example, electronics can be placed within the container for shipment tracking purposes. In this case, the electronics may monitor the position of the container, may monitor the status of the doors of the container, may have cameras or other sensors to capture images of the surrounding area of the container, among other functionalities. A container having such electronics installed therein may be mounted to a vehicle or shipping container.

Electronics installed within a container may need to be serviced or have that their batteries changed. In this regard, it would be desirable to be able to unmount the container, open the container and service of the electronics or battery.

While the present disclosure is provided with regard to a container that can be mounted to a vehicle or shipping container, the present disclosure is not limited to such functionality. For example, in other cases, electronics may be mounted to poles or streetlights, buildings or other infrastructure in order to provide for varied functionality such as providing for roadside units within intelligent transportation systems, for mounting cameras or other sensors, among other functionality.

When a container having sensitive materials therein needs to be mounted in an area where the container could be exposed to adverse elements, the container should be sealed in order to protect the sensitive materials therein. For example, electronics for a sensor that is mounted to a vehicle or shipping container should not be exposed to water. However, a permanent seal may not be desirable in some situations, such as when the materials within the container need to be serviced or batteries replaced.

Various solutions to prevent water intrusion into containers have been attempted in the past. Reference is now made to FIG. 1. In FIG. 1, a container 100 includes a base portion 110 and a lid portion 120. A seal 130 is placed between the lid portion 120 and base portion 110.

The seal in the embodiment of FIG. 1 requires pressure by the lid portion 120 onto base portion 110 to ensure the container remains watertight. The lid portion 120 may be held to the base portion 110 through a variety of means but in the example of FIG. 1, fastening is done with screw holes 140 through which screws or bolts could be applied to a hold of the lid portion 120 to the base portion 110.

However, a screw may loosen. For example, it has been found that the vibration of a vehicle may cause such screws to loosen. A loose screw with the container of FIG. 1 will allow water to seep into the container.

Further, in some cases, seal 130 may become deformed when installing the seal, thereby allowing for water seepage into the container based on the deformed portion of the seal.

Figure 2:
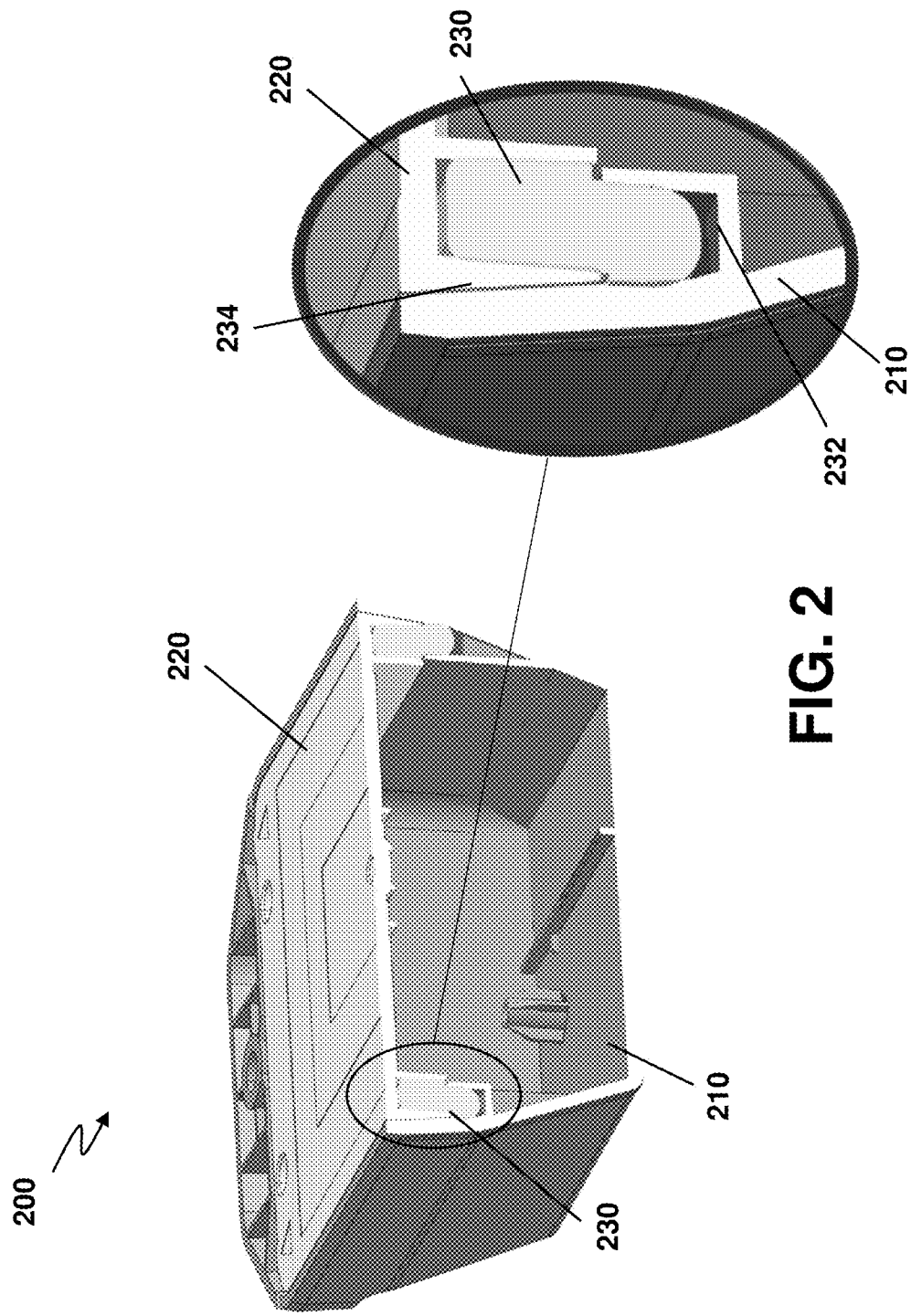
FIG. 2 is a perspective view of a container in which a rubber insert is placed in a channel within a lid portion and base portion of a container, FIG. 2 further including an enlarged view of the rubber insert.

In other systems, the seal may comprise a piece of rubber fit between a lid and a container. Reference is now made to FIG. 2.

In the embodiment of FIG. 2, a container 200 includes a base portion 210 and a lid portion 220. A seal 230 is a resilient rubber band that fits within a slot 232 on base portion 210 and a slot 234 in lid portion 220.

However, with the embodiment of FIG. 2, the seal has various trade-offs. In particular, compression of the seal needs to be traded for ease of assembly. With more compression, a better seal is established. However, such rubber seal having more compression is also more of a difficult to assemble. Specifically, during assembly, the rubber needs to be inserted into the rigid housing slot. After assembly, such rubber is typically not in good shape, may potentially be twisted, wrinkled or stretched.

Further, utilizing a seal such as that described with regard to FIG. 2 takes considerable room within the container since thin rubber will not work. In this regard, when space within the container is limited, a large seal may be undesirable.

Further, it has been found that the compressed rubber could deform the outer housing, resulting in potential for water leakage, loss of fit of the container within its mounting platforms, among other deficiencies. In this regard, the embodiment of FIG. 2 provides only marginal sealing efficiency.

Based on the above, a container with a seal that will prevent water seepage but still allow for ease of assembly is provided. Reference is now made to FIGS. 3 to 12. The same reference numerals to refer to the same element are used in the various drawing figures.

A container 300 includes a base portion 310 and a lid portion 320.

Base portion 310 includes a base 312 and an outer wall 314. In the embodiment of FIGS. 3 to 12, the outer wall 314 extends at an obtuse angle to the base 312. However, in other embodiments the outer wall 314 could extend perpendicularly to the base 312.

Figure 3:
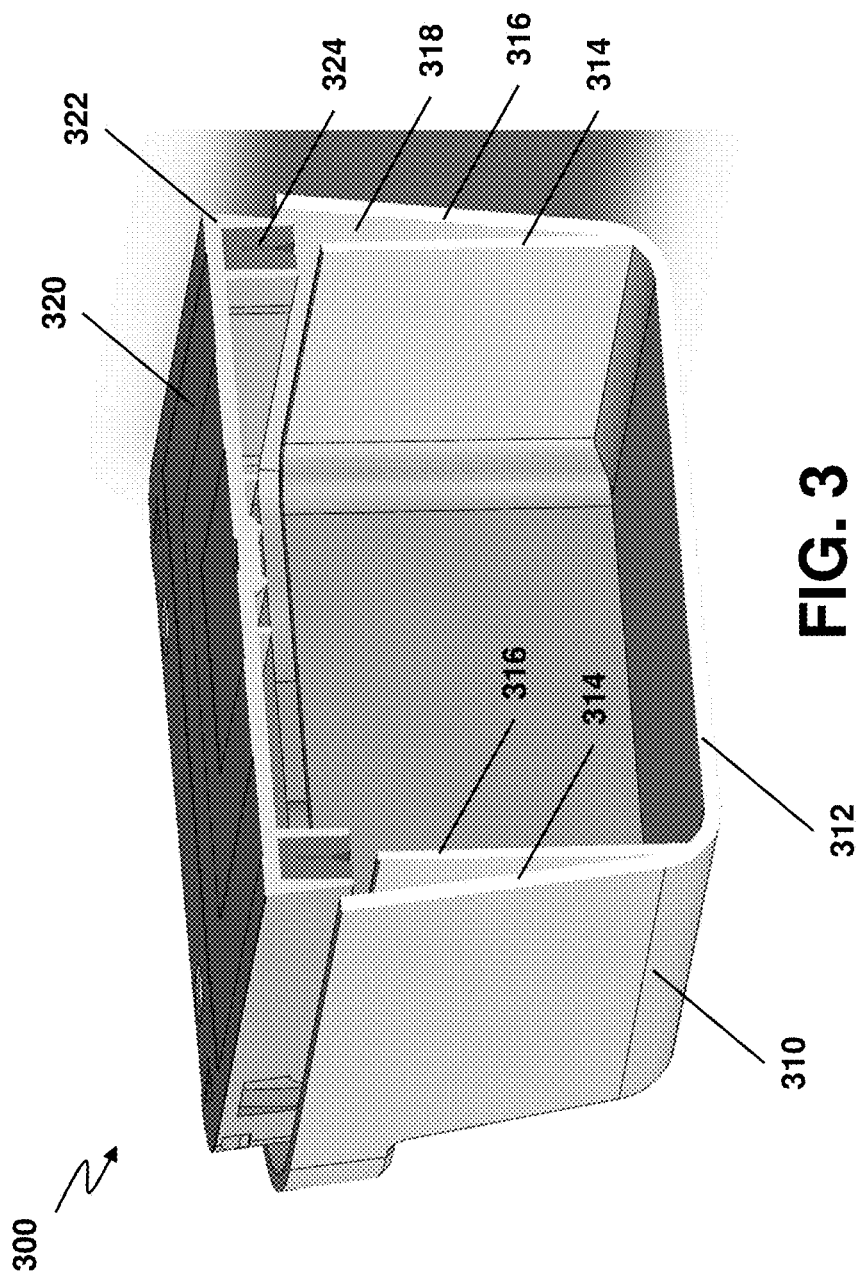
FIG. 3 is a perspective view of a cross section of a container according to one embodiment of the present disclosure.

Further, base portion 310 includes an inner wall 316. Inner wall 316, in the embodiments of FIGS. 3 to 12, extends substantially perpendicularly from the base 312 to form an inner ridge on which to mount a lid portion 320. While the embodiment of FIG. 3 shows the inner wall 316 extending from the base portion 312, in other embodiments the inner wall 316 may extend from the outer wall 314.

Inner wall 316 and outer wall 314 thereby form a channel 318 therebetween.

In some embodiments, the inner wall 316 may be formed through an injection molding process concurrently with that the remainder of the container. In other cases, inner wall 316 may be secured to the inside of the container 300, for example utilizing welding, plastic laser welding, or adhesives, among other techniques.

Base portion 310 may further include mounting means (not shown) for mounting equipment therein. For example, the mounting means may be disposed on base 312 or on an inner portion of the inner wall 316 in some embodiments, and may accommodate screws, printed circuit boards, electronic devices and the like. However, in other embodiments, no mounting means are provided within container 300.

Figure 4:
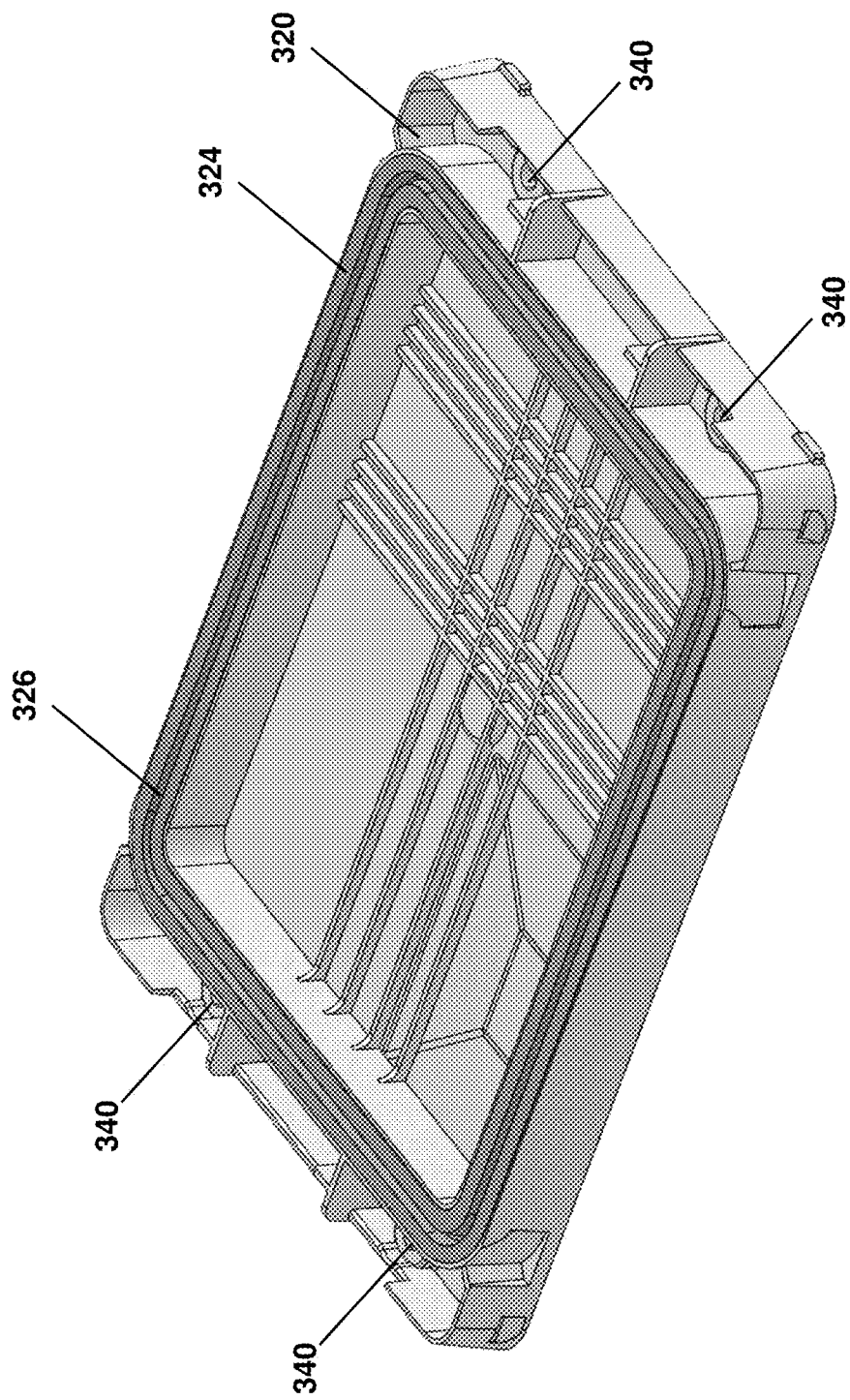
FIG. 4 is a perspective view of an inside of a lid portion of the container of FIG. 3.
Figure 5:
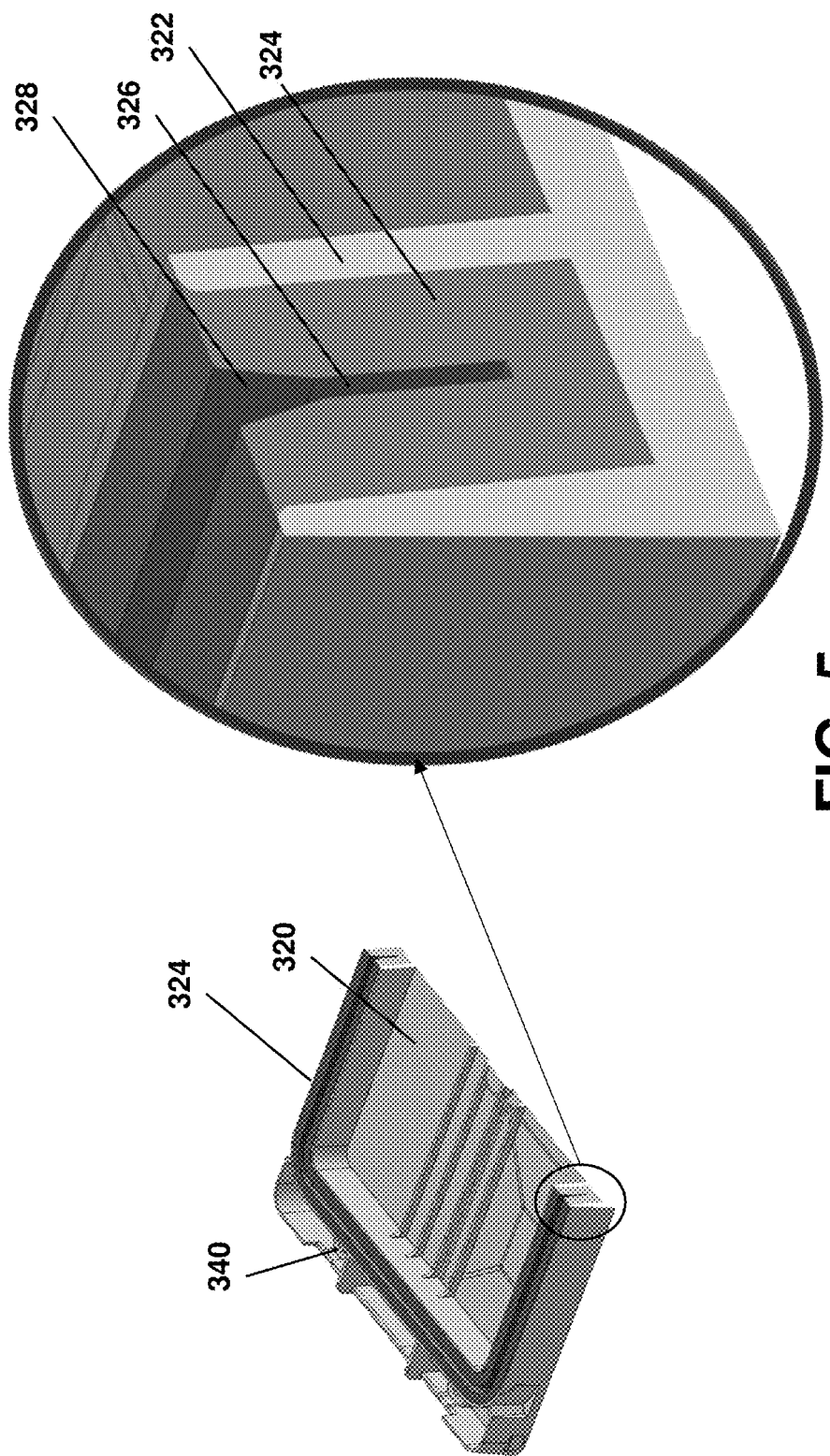
FIG. 5 is a perspective view cross section of the lid portion of FIG. 4, along with an enlarged view of a seal within the lid portion.
Figure 6:
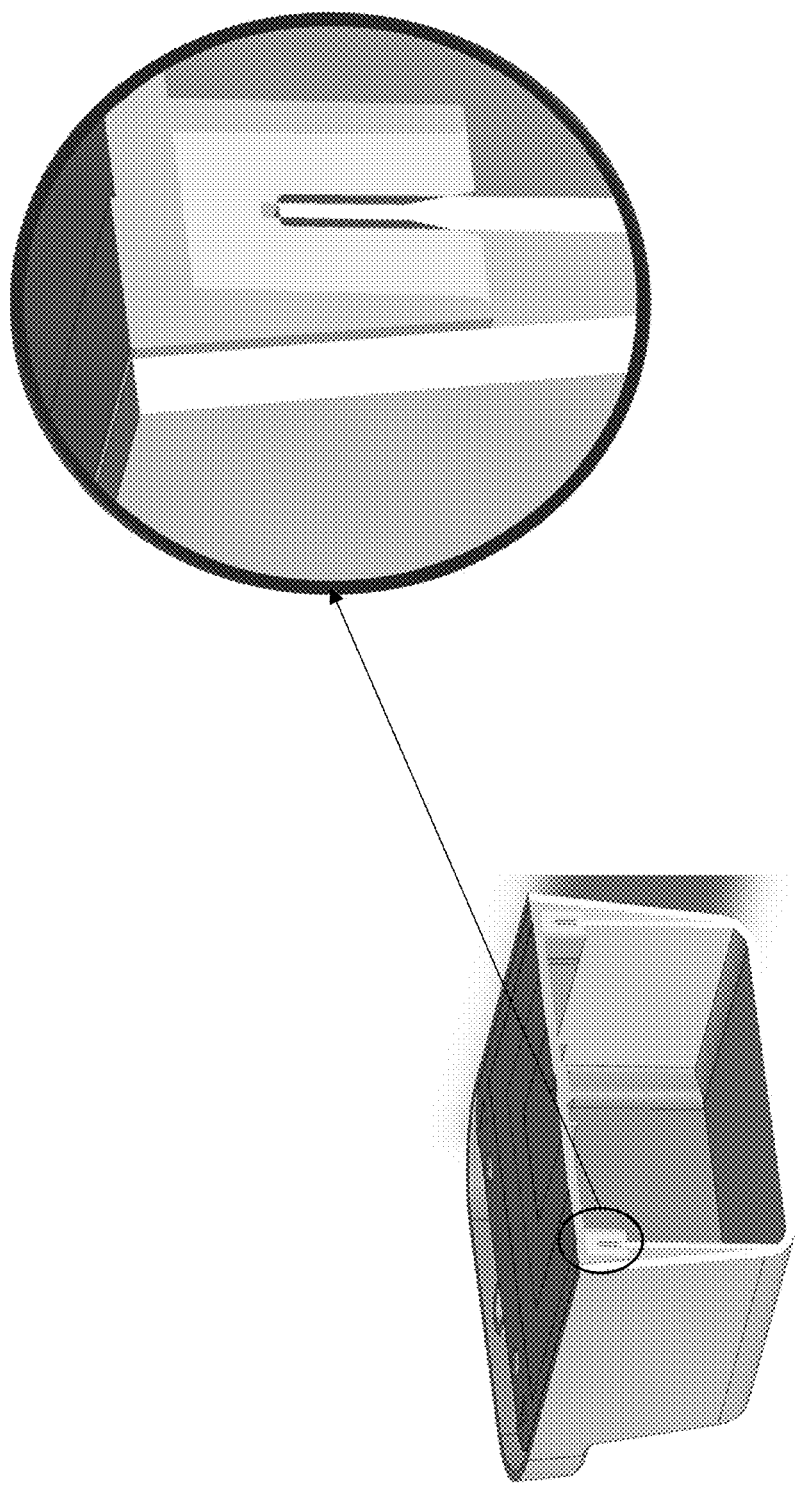
FIG. 6 is a perspective view of a cross section of a container according to the embodiment of FIG. 3 having a closed lid and showing an enlarged view of a seal engaged on an inner wall.

Lid portion 320 is best seen, for example, in FIGS. 4 and 5. Lid portion 320 includes a slot 322 and into which a seal 324 may be inserted or mounted. For example, slot 322 may be formed by two flanges extending away from a surface of lid portion 320 in some embodiments.

As seen in FIGS. 4 and 5, the seal 324 may be generally u-shaped in order to accommodate at the top portion of inner wall 316.

In one embodiment, seal 324 may be fixed within a slot 322 utilizing a suitable adhesive depending on the material used for the lid portion 320 and the material used for seal 324.

In another embodiment, the seal 324 may be combined together by co-molding(insert-molding) the lid and rubber together, for example if the lid is made of plastic.

Seal 324 includes groove 326 therein. In some embodiments, groove 326 may be flared at a first end 328 thereof. The flaring may be on one side or both sides of the groove 326.

While the seal in FIG. 5 is shown to have equal dimensions on each side of groove 326, in some embodiments the rubber may be thicker on a first side of the seal than the second side of the seal. Further, the seal 324 may be more resilient on one side than the other side of the groove in some cases.

Based on the configuration of seal 324, the sealing may be on one side, or on both sides. For example, reference is made to FIGS. 7, 8 and 9.

Figure 7:
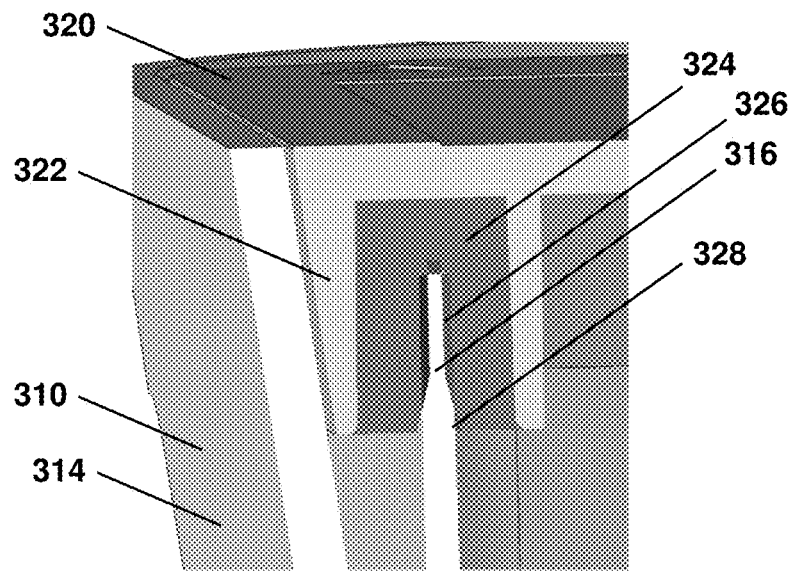
FIG. 7 is a perspective view of a cross section of a container with a closed lid showing a first sealing configuration.
Figure 8:
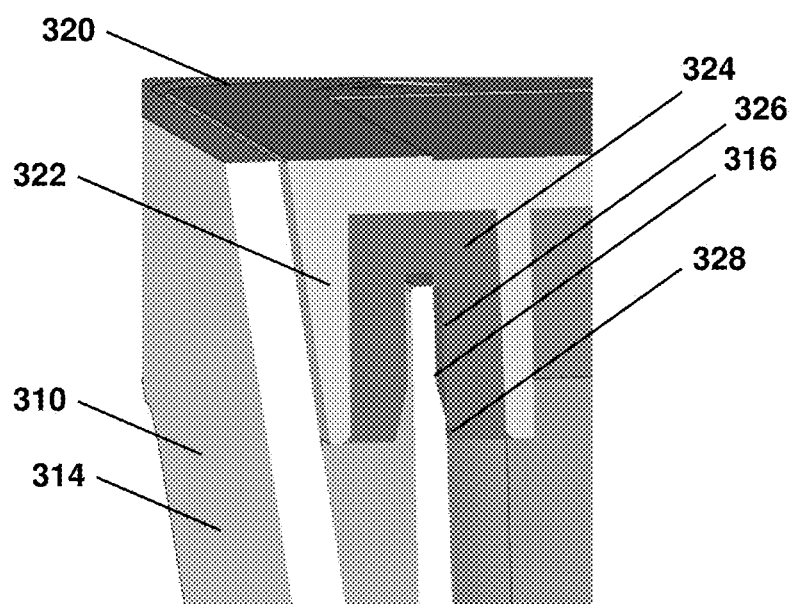
FIG. 8 is a perspective view of a cross section of a container with a closed lid showing a second sealing configuration.
Figure 9:
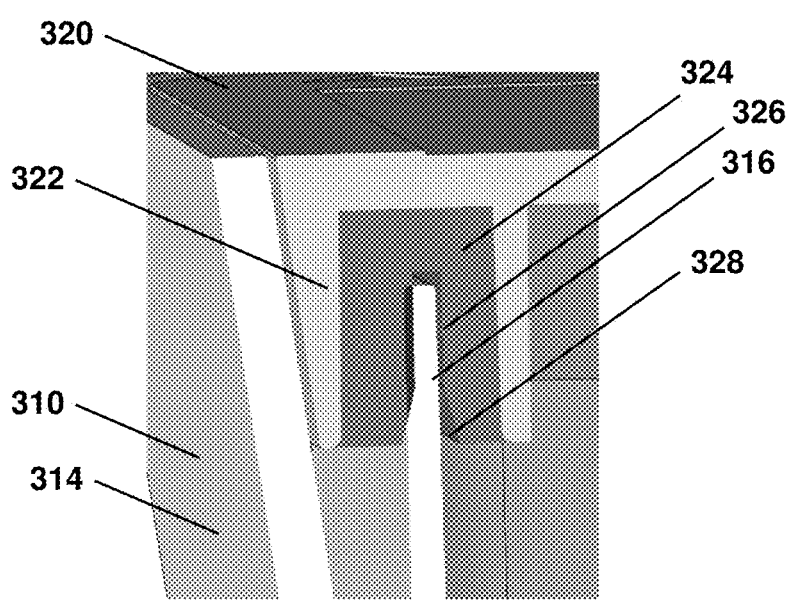
FIG. 9 is a perspective view of a cross section of a container with a closed lid showing a third sealing configuration.

FIG. 7 shows a seal on both sides of the inner wall 316.
FIG. 8 shows a seal on the inner side of the inner wall 316.
FIG. 9 shows the seal on the outer side of the inner wall 316.

In practice, the seal 324 could be relatively thin, and thus use less space within a container. This could be useful in situations where the container needs to be smaller than, for example, the solution shown with regard to FIG. 2. In one case, the applicant has found that the seal with could be less than 2 mm.

Further, since the inner wall 316 projects into the groove in the U-shaped seal, the sealing surface is wider than previous solutions, which is more reliable. A loose housing screw will not affect the seal of the container 300.

Figure 10:
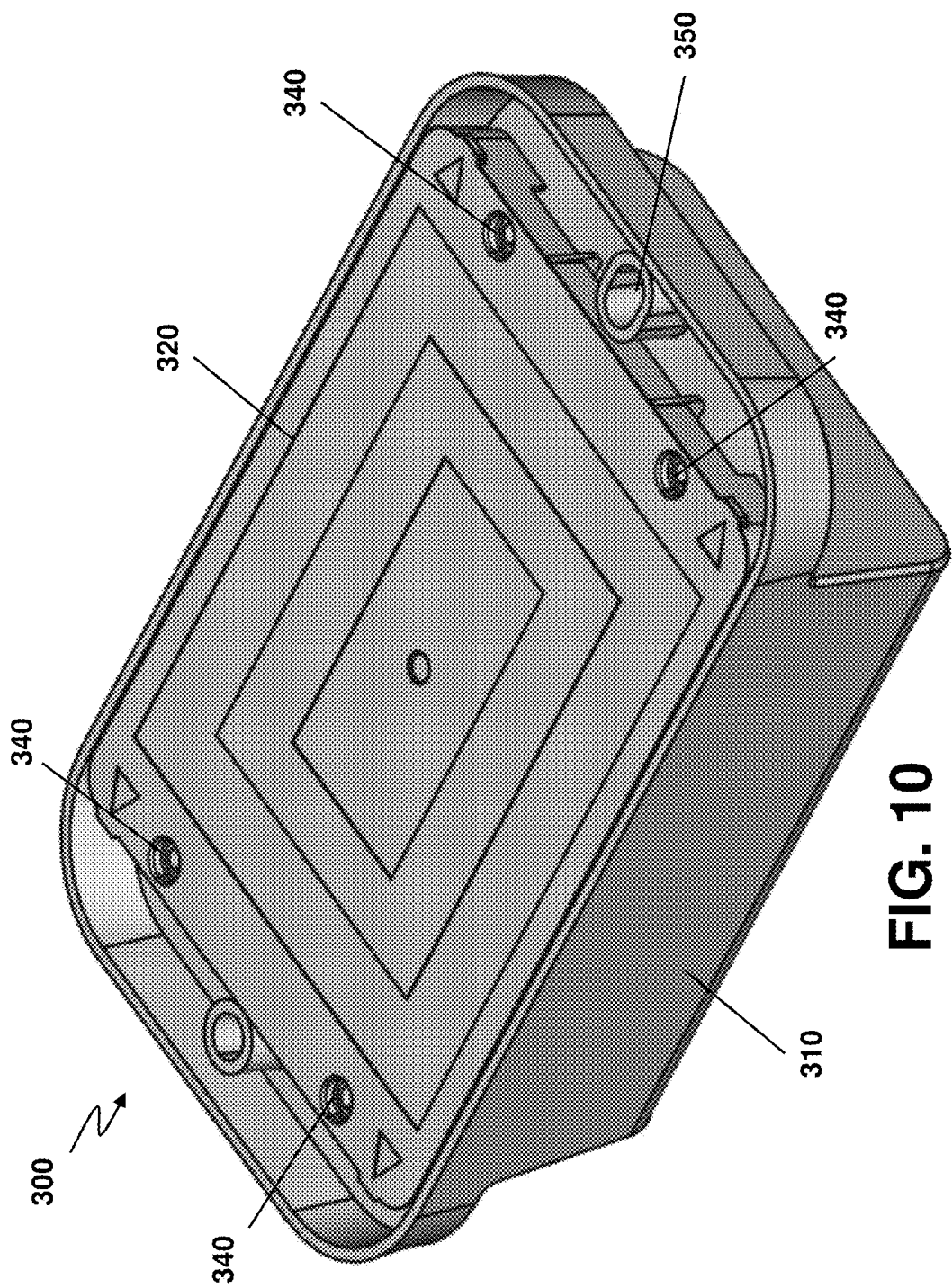
FIG. 10 is a perspective view of the container of FIG. 3 with its lid in a closed position.
Figure 11:
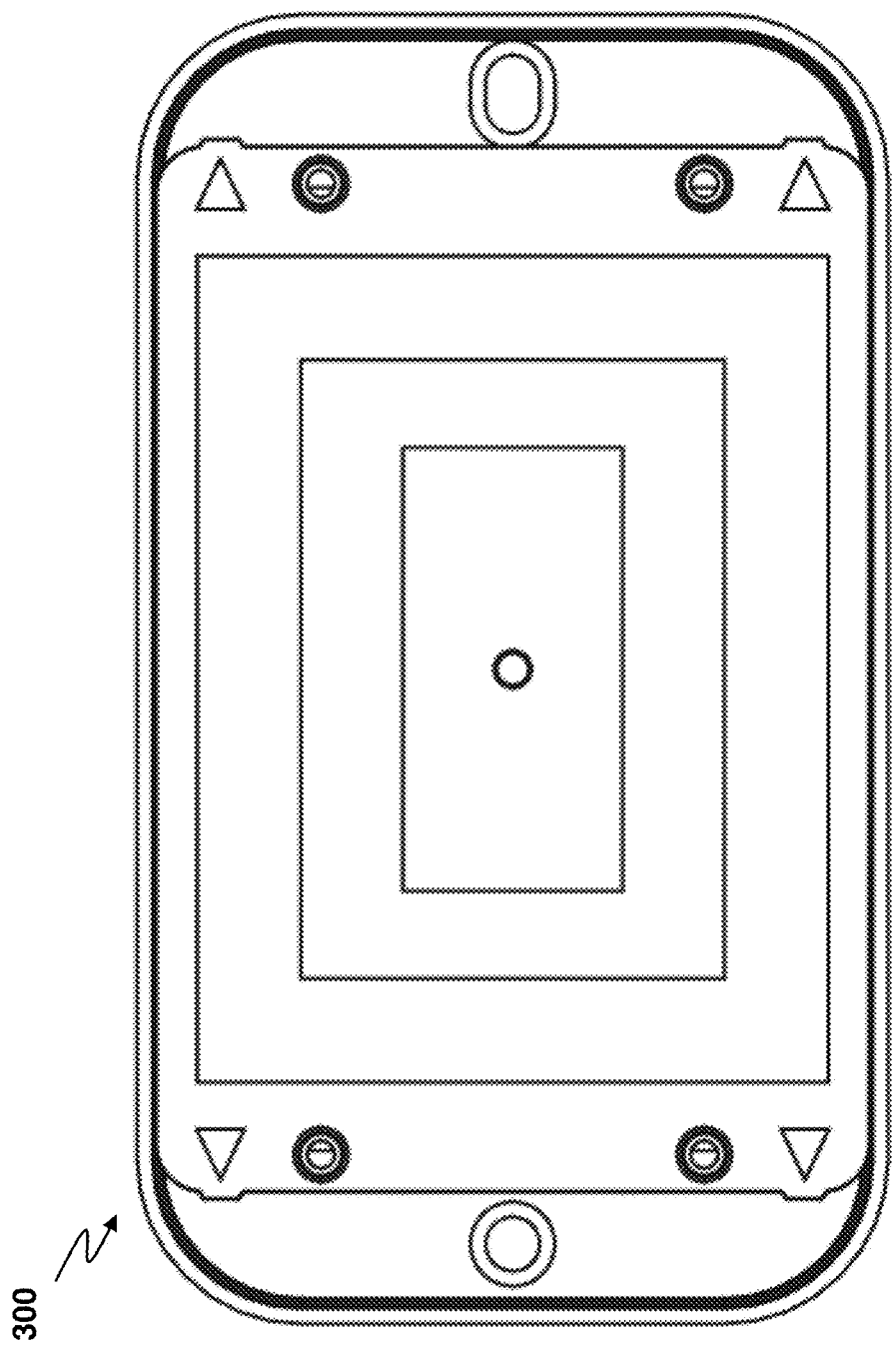
FIG. 11 is a top plan view of the container of FIG. 3.

In practice, equipment may be mounted within a container 300 and the lid then inserted onto the container to create a closed container as shown in perspective view in FIG. 10 and plan view in FIG. 11. The assembly would merely require the insertion of the lid over the inner wall and the application of pressure to slide the inner wall 316 of the base portion 310 into the groove 326. The widening or flaring of the first end 328 of the groove 326 of seal 324 could help in the alignment of the lid portion 320 over the base portion 310 and more particularly to the inner wall 316 with regard to the groove 326.

In this case, the seal is formed through the length of the contact between the seal and the inner wall. No outward pressure is provided which may cause deformation and therefore failure of the container sealing. Further, any water which may seep between the lid portion 320 and the outer wall 314 of base portion 310 would be trapped within the channel 318 and therefore would not affect the payload within the container 300.

Once the lid is installed onto the base portion, it may be held in place, for example utilizing screws or bolts inserted into screw holes 340. Other options for sealing could include clips, snaps, latches or other fastening means.

Figure 12:
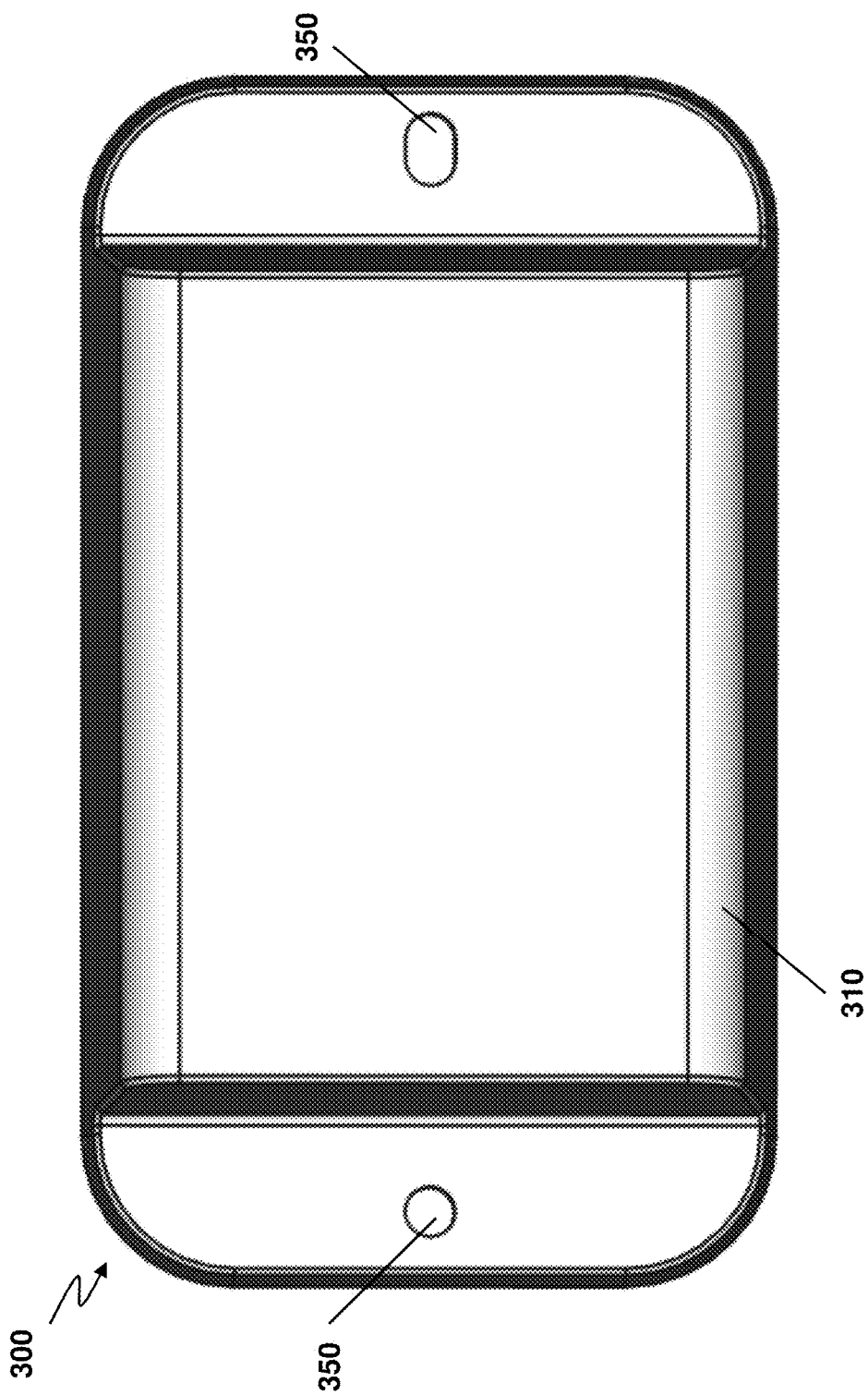
FIG. 12 is a bottom plan view of the container of FIG. 3.

Thereafter, referring to FIG. 12, the container 300 may be secured to its mount utilizing holes 350. In other cases, the container may snap onto a base or be secured through other physical or mechanical means.

For example, if the mount is a shipping container, bolts or screws that could be used to attach to the container to the shipping container. In other cases, the bolts or screws could be utilized to attach the container to a base mounting mechanism. Other options for securing the container to its mount would be possible.

Based on the embodiments of FIGS. 3 to 12, a weatherproof container for a sensitive payload is provided which allows for a better seal to protect the payload within the container. Assembly of the container is the made easier through the sealing mechanism with less likelihood of the seal failing or causing the container to deform or warp.

The embodiments described herein are examples of structures, systems or methods having elements corresponding to elements of the techniques of this application. This written description may enable those skilled in the art to make and use embodiments having alternative elements that likewise correspond to the elements of the techniques of this application. The intended scope of the techniques of this application thus includes other structures, systems or methods that do not differ from the techniques of this application as described herein, and further includes other structures, systems or methods with insubstantial differences from the techniques of this application as described herein.

Also, techniques, systems, subsystems, and methods described and illustrated in the various implementations as discrete or separate may be combined or integrated with other systems, modules, techniques, or methods. Other items shown or discussed as coupled or directly coupled or communicating with each other may be indirectly coupled or communicating through some interface, device, or intermediate component, whether electrically, mechanically, or otherwise. Other examples of changes, substitutions, and alterations are ascertainable by one skilled in the art and may be made.

While the above detailed description has shown, described, and pointed out the fundamental novel features of the disclosure as applied to various implementations, it will be understood that various omissions, substitutions, and changes in the form and details of the system illustrated may be made by those skilled in the art.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

The invention claimed is:

1. A waterproof container comprising:
   a base portion, the base portion comprising:
      a base;
      an outer wall extending from the base at an obtuse angle from the base; and
      an inner wall disposed inwardly from the outer wall, thereby forming a channel between the inner wall and the outer wall, wherein the inner wall extends perpendicularly to the base portion, wherein the channel is triangular; and
   a lid portion, the lid portion comprising:
      a slot within the lid portion; and
      a seal configured to fit within the slot, the seal including a groove therein,
   wherein the groove of the seal is configured to accept an end of the inner wall therein when said lid portion is affixed to said base portion; and
   wherein the groove of the seal comprises an empty space defined by two parallel walls.

2. The waterproof container of claim 1, wherein the inner wall extends from the base.

3. The waterproof container of claim 1, wherein the inner wall extends from the outer wall.

4. The waterproof container of claim 1, wherein the seal is one of co-molded within the slot or affixed within the slot on the lid portion with adhesive.

5. The waterproof container of claim 1, wherein the base portion further includes mounts for mounting equipment within the waterproof container.

6. The waterproof container of claim 1, wherein the seal is thicker on a first side of the groove than a second side of the groove.

7. The waterproof container of claim 1, wherein the seal is more resilient on a first side of the groove than a second side of the groove.

8. The waterproof container of claim 1, wherein an outer end of the groove in the seal is flared.

9. A waterproof container comprising:
   a base portion, the base portion comprising:
      a base;
      an outer wall extending from the base; and
      an inner wall disposed inwardly from the outer wall and extending from the outer wall in a direction which is perpendicular to the base, thereby forming a triangular channel between the inner wall and the outer wall; and
   a lid portion, the lid portion comprising:
      a slot within the lid portion; and
      a seal configured to fit within the slot, the seal including a groove therein,
   wherein the groove of the seal is configured to accept an end of the inner wall therein when said lid portion is affixed to said base portion; and
   wherein the groove of the seal comprises an empty space defined by two parallel walls.

10. The waterproof container of claim 9, wherein the seal is one of co-molded within the slot or affixed within the slot on the lid portion with adhesive.

11. A waterproof container comprising:
    a base portion, the base portion comprising:
       a base;
       an outer wall extending from the base at an obtuse angle from the base; and
       an inner wall disposed inwardly from the outer wall, thereby forming a channel between the inner wall and the outer wall, wherein the inner wall extends perpendicularly to the base portion, wherein the channel is triangular; and a lid portion, the lid portion comprising:
- a slot within the lid portion; and
- a seal configured to fit within the slot, the seal including a groove therein, the groove comprising a straight portion, the straight portion being defined by two parallel walls, and a flared portion at the outer end thereof, wherein the groove of the seal is configured to accept an end of the inner wall therein when said lid portion is affixed to said base portion.

12. The waterproof container of claim 11, wherein the seal is one of co-molded within the slot or affixed within the slot on the lid portion with adhesive.

13. The waterproof container of claim 11, wherein the seal is more resilient on a first side of the groove than a second side of the groove.

* * * * *